US006961368B2

(12) United States Patent
Dent et al.

(10) Patent No.: US 6,961,368 B2
(45) Date of Patent: Nov. 1, 2005

(54) ADAPTIVE ANTENNA OPTIMIZATION NETWORK

(75) Inventors: Paul W. Dent, Pittsboro, NC (US); Howard Eugene Holshouser, Efland, NC (US); John Charles Phillips, Newhill, NC (US); Rod Dolman, Forest, VA (US); Ron Boesch, Morrisville, NC (US)

(73) Assignee: Ericsson Inc., Research Triangle Park, NC (US)

( * ) Notice: Subject to any disclaimer, the term of this patent is extended or adjusted under 35 U.S.C. 154(b) by 346 days.

(21) Appl. No.: 09/770,804

(22) Filed: Jan. 26, 2001

(65) Prior Publication Data

US 2002/0101907 A1 Aug. 1, 2002

(51) Int. Cl.[7] .......................... H04L 5/16; H04L 27/04; H04L 27/06
(52) U.S. Cl. ........................ 375/219; 375/295; 375/316
(58) Field of Search ............................. 375/219, 260, 375/316, 295, 224, 345, 220; 455/73, 75, 455/83, 115; 370/464, 442; 343/703, 860, 343/863, 862, 861, 850, 852

(56) References Cited

U.S. PATENT DOCUMENTS

| 4,422,047 A | * | 12/1983 | Wright .......................... 330/51 |
| 4,485,360 A | * | 11/1984 | Seward ....................... 333/17.3 |
| 5,048,059 A | | 9/1991 | Dent |
| 5,052,049 A | | 9/1991 | Andros et al. .............. 455/186 |
| 5,070,303 A | | 12/1991 | Dent |
| 5,084,669 A | | 1/1992 | Dent |
| 5,241,702 A | | 8/1993 | Dent |
| 5,530,722 A | | 6/1996 | Dent |
| 5,564,086 A | * | 10/1996 | Cygan et al. ................ 455/126 |
| 5,568,520 A | | 10/1996 | Lindquist et al. |
| 5,614,904 A | | 3/1997 | Dent |
| 5,749,051 A | | 5/1998 | Dent |
| 5,778,308 A | * | 7/1998 | Sroka et al. .............. 455/115.1 |
| 5,890,051 A | | 3/1999 | Schlang et al. |
| 5,955,817 A | | 9/1999 | Dhuler et al. |
| 5,962,949 A | | 10/1999 | Dhuler et al. |
| 5,994,816 A | | 11/1999 | Dhuler et al. |
| 6,009,312 A | | 12/1999 | Dolman |
| 6,023,121 A | | 2/2000 | Dhuler et al. |
| 6,057,520 A | | 5/2000 | Goodwin-Johansson |

FOREIGN PATENT DOCUMENTS

| EP | 0883250 | 12/1998 |
| WO | WO 9962193 | 12/1999 |
| WO | WO 0031885 | 6/2000 |

OTHER PUBLICATIONS

Donald G. Fink et al. "Electronics Engineers' Handbook," McGraw-Hill, third edition, 1989, pp 9-3, 9-7 and 9-17.*

* cited by examiner

Primary Examiner—Tesfaldet Bocure
(74) Attorney, Agent, or Firm—Coats & Bennett, P.L.L.C.

(57) ABSTRACT

An adjustable matching network is provided for a wireless communications device transmitting and receiving signals in multiple frequency bands via an antenna. The adjustable matching network selectively connecting the antenna to a select power amplifier corresponding to a selected transmit frequency band and automatically matching the impedance of the antenna to the select power amplifier. The adjustable matching network also selectively connecting the antenna to a select bandpass filter corresponding to a selected receive frequency band and automatically matching the impedance of the antenna to the select bandpass filter.

58 Claims, 10 Drawing Sheets

ADAPTIVE ANTENNA OPTIMIZATION NETWORK

FIELD OF THE INVENTION

The present invention is directed toward antenna matching networks for use in communication devices that transmit and receive signals over the air and, more particularly, toward an adaptive antenna matching network for quasi-continuously rematching, or tuning, the antenna to the transmitter in order to minimize signal distortion and/or inefficiency.

BACKGROUND OF THE INVENTION

Automatic Antenna Tuning Units (ATUs) are well known in the field of High Frequency (HF) (2–30 MHz) radio transceiver design, where the radio and antenna must be designed to operate over wide frequency bands. High frequency ATUs are typically designed to handle significant power levels, such as one kilowatt, and utilize, for example, motor-driven variable capacitors and inductors that are capable of withstanding many kilovolts of RF (Radio Frequency) voltage and many amps of current. Such ATUs are, however, bulky, expensive, and operationally slow.

Typically, high frequency ATUs operate by initiating a tuning phase after a change to the transmitter operating frequency. During the tuning phase, transmission of a possibly unmodulated carrier occurs and the ATU searches for the minimum VSWR (Voltage Standing Wave Ratio) condition. The status of the ATU is then frozen until the next frequency change or until manual reinitiation of the tuning phase.

The VSWR is a ratio of the amplitude of the electric field or voltage at a voltage minimum to that at an adjacent maximum in a stationary wave system. The VSWR value is an expression of the impedance mismatch in the antenna resulting in signal reflection. The higher the value of the VSWR at a given frequency, the more signal loss that occurs as a result of signal reflection. Thus, it is desirable to have a low value for VSWR within a given frequency band. The lower the VSWR value, the less signal loss that occurs, resulting in improved signal transmission.

In other frequency bands, for example, the Very High Frequency (VHF) (30–100 Mhz) amps, the antenna Q (quality)-factors are generally much less then high frequency antenna Q-factors. Thus, very high frequency ATUs can be made using step-tuned inductors or capacitors and associated relays or PIN diodes for switching in or out the correct combination of capacitors. Typically, a set of switch commands are predetermined for each frequency channel and stored as binary bytes in a read-only memory. These switch commands switch in or out the correct combination of matching components. Thus, upon a change in frequency, the stored switch commands can be retrieved from the memory for the new frequency channel and used to operate the various switches. This type of antenna matching permits frequency hopping radios to be made where the antenna is tuned for each new hop frequency. The antenna tuning typically occurs in a time period between each new frequency hop during which no transmission takes place. This time period is typically known as the guard time. However, in prior art frequency hopping, a mismatch observed on a previous frequency hop is not correlated with the mismatch on a subsequent frequency hop. The stored tuning commands for the subsequent frequency hop are simply retrieved from memory to switch in or out the correct combination of matching components. There is no adaptive correction based on previous mismatches.

In current applications, wireless communication devices, such as cellular phones, must operate at various frequencies in the RF, HF, VHF, UHF (Ultra-High Frequency) or low microwave bands to transmit and receive signals in, for example, a Time Division Multiple Access (TDMA) network. Without a tuning device, the antenna impedance is a function of the operating frequency and may also vary substantially depending upon the proximity of the antenna to the human body. Therefore, it may not be sufficient to determine fixed matching commands for the various channel frequencies, such as in conventional frequency hoping radios, due to the varying proximity of the cellular phone, and hence the antenna, to a user's body. Further, the proximity of the cellular phone to the user's body may vary during a call, necessitating the detection and correction of a resultant impedance change without interrupting the call or otherwise distorting the signal. There is therefore a need for a very small, low cost, adaptive antenna matching device that is capable of operating continuously during normal transceiver use.

The present invention is directed toward overcoming one or more of the above-mentioned problems.

SUMMARY OF THE INVENTION

A wireless communication device, i.e., a cellular phone, in accordance with the invention includes an antenna for transmitting signals in any channel in at least one frequency band and a receiver. The transmitter and the receiver are operationally connected to the antenna by a transmit/receive duplexer which can include a duplexing filter or, alternatively, a transmit/receive (T/R) switch. In accordance with the invention, an adaptive electronically adjustable matching network is provided, capable of being located anywhere in the path between the transmitter output and the antenna.

For example, in a first embodiment, the adjustable matching network is located between the antenna and the duplexer, permitting the adjustable matching network to be operational in both the transmit and the received paths.

In a second embodiment, the adjustable matching network is located between the transmitter output and the duplexer, and is operational only in the transmit path.

In a third embodiment, the adjustable matching network includes the duplexer in the form of, for example, an integrated T/R switch, providing a separate connection for the receiver and the transmitter and being operational in both the transmit and receive paths.

In a fourth embodiment, the adjustable matching network operates to match the antenna for operation in one of at least two different frequency bands. This embodiment finds particular utility in cellular phones which operate in at least two different transmit bands, such as a first band in the 800 MHz region and a second band in the 1900 MHz region. The adjustable antenna matching network matches the antenna to either the 800 MHz transmitter or the 1900 MHz transmitter. If the transmitters for the at least two different frequency bands are the same device or have a single transmit signal output, the adjustable matching network is configured to provide a connection to the single transmit signal output. On the other hand, if the transmitters for the at least two different frequency bands are different devices or have separate outputs, the adjustable matching network is configured to provide separate transmit signal connections for each.

The adjustable matching network is controlled via a signal sampling device, referred to herein as an impedance mismatch measuring and quantizing unit, which is located between the transmitter output and the adjustable matching network. The signal sampling device measures the amplitude and phase of the reflected transmitted signal to determine the quality of the impedance match presented to the transmitter by the adjustable matching network and provides a corresponding digital indication that is quantized into one of a predetermined number of quality levels. For example, the antenna complex reflection coefficient measured by the signal sampling device may be quantized into one of two amplitudes and one of four phases. The two amplitude levels correspond respectively to a determination that the complex reflection coefficient is adequately small, indicating that the antenna is properly matched and no tuning is needed or, alternately, that the complex reflection coefficient is sufficiently large, indicating an antenna mismatch requiring tuning of the antenna. The four phase levels indicate the quadrant of, for example, a Smith chart, in which the complex reflection coefficient lies.

The quantized reflection coefficient is averaged, for example, over a TDMA burst during which the transmitter is transmitting. The order of averaging and quantizing is immaterial to the operation of the inventive adjustable matching network. The complex reflection coefficient may be averaged over a burst prior to quantizing or, alternatively, may be quantized at various intervals over the burst with the quantized value occurring most often used as the average value.

The quantized and averaged complex reflection coefficient is input to a controller, such as a microprocessor or other programmable device. Using preprogrammed information on the current matching network parameters, the microprocessor determines from the quantized and averaged value whether the antenna is mismatched and a change needs to be made to the adjustable matching network parameters to tune the antenna appropriately. If it is determined that a change to these parameters is required, control signals are sent from the microprocessor to change the adjustable matching network parameters during an idle period in the TDMA burst when the cellular phone is neither receiving nor transmitting, i.e., during an idle slot. In this manner, changes to the adjustable matching network parameters made ready for the next TDMA transmit burst, but are effectuated when power is not being applied so as not to cause switching glitches during either transmit or receive periods. The inventive adjustable matching network is not limited to TDMA systems, however, but may utilized in any system which incorporates idle time slots where the wireless communication device is neither transmitting or receiving.

The adjustable matching network preferably implements MicroElectronic Machine (MEM) devices. An MEM device includes, for example, a gold leaf pattern attached at one end to a contact point on a substrate, with the other end curled up and away from the substrate. This position defines an open position of the MEM device. When a voltage potential is applied between the gold leaf and the substrate, the gold leaf is attracted by electrostatic attraction to bend and contact the substrate at another contact point thereon, shorting the two contacts and closing the switch. Conventional MEM devices are physically very small and can be inexpensively fabricated on semiconductor chips by conventional automatic mass production processes. MEM devices are fast switching devices operational in a few tens of microseconds, with a longevity of billions of repeated switching operations.

The adjustable matching network may include a set of MEM devices/switches used to switch in or out capacitors having a binary capacitance ratio to one another of, for example, dC:2dC:4dC:8dC:16dC . . . , where dC is a least amount of change in capacitance. Binary switched inductors may also be constructed in a like manner.

In a preferred implementation, the adjustable matching network has two binary adjustable banks of reactance (capacitors or inductors), with one adjustable bank causing an impedance shift along one axis (I-axis) of the complex plane of the reflection coefficient, and the other adjustable bank causing an impedance shift along the other axis (Q-axis) of the complex plane of the reflection coefficient. The controller determines, from the quantized and averaged reflection coefficient phase values, in which quadrant of the complex plane the reflection coefficient lies and determines the signs of changes to the associated adjustable reactances that will move the reflection coefficient towards zero. The controller then sends control signals to the adjustable matching network to change the capacitive/inductive and real parts of the reactances by one least significant increment or decrement according to the sign of the respective control signal. Preferably, the control signal is sent between TDMA bursts during a time when the cellular phone is neither receiving or transmitting, i.e., during an idle slot.

It is an object of the present invention to provide a low cost adjustable matching network occupying minimal space.

It is a further object of the present invention to provide an adjustable matching network for quasi-continuous matching of the antenna to the transmitter during idle time slots when the wireless communication device incorporating the adjustable matching network is neither transmitting nor receiving.

It is yet a further object of the present invention to provide an adjustable matching network for rematching the antenna to the transmitter based upon prior measured antenna mismatches.

Other aspects, objects and advantageous of the present invention can be obtained from a study of the application, the drawings, and the appended claims.

DETAILED DESCRIPTION OF THE INVENTION

Figure 1:
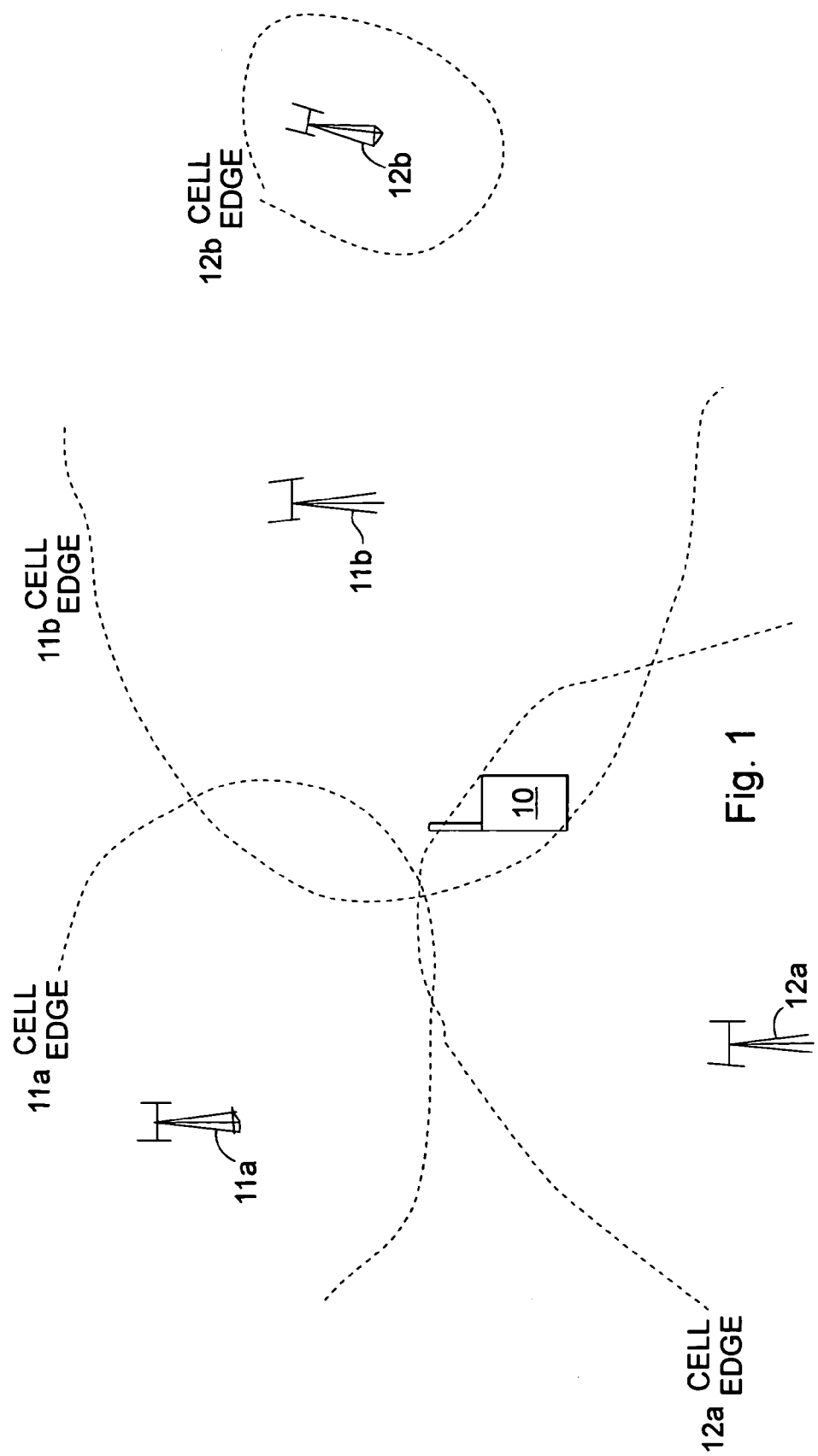
FIG. 1 illustrates a wireless communications network including a wireless communication device incorporating the inventive adjustable matching network.

FIG. 1 illustrates a wireless communication device, such as a cellular phone, 10 capable of operating in a cellular network including first 11a, 11b and second 12a, 12b base stations. The first base stations 11a, 11b transmit and receive signals using a first pair of spaced frequency bands, while the second base stations 12a, 12b transmit and receive signals using a second pair of spaced frequency bands different from the first pair of spaced frequency bands. As shown in FIG. 1, the cell phone 10 is located within the cell range of both base station 12a and base station 11b. When the cellular phone 10 can communication via either the first base stations 11a, 11b (using the first pair of spaced frequency bands) or the second base stations 12a, 12b (using the second pair of spaced frequency bands), the cellular phone 10 is known as a "dual-band" phone. Multi-band phones (communicating in more than two pairs of spaced frequency bands) are also known. In both dual-band and multi-band phones, one of the spaced frequency band-pairs may be used for communicating via an orbiting satellite(s), such as in GPS (Global Positioning System) applications.

Figure 2:
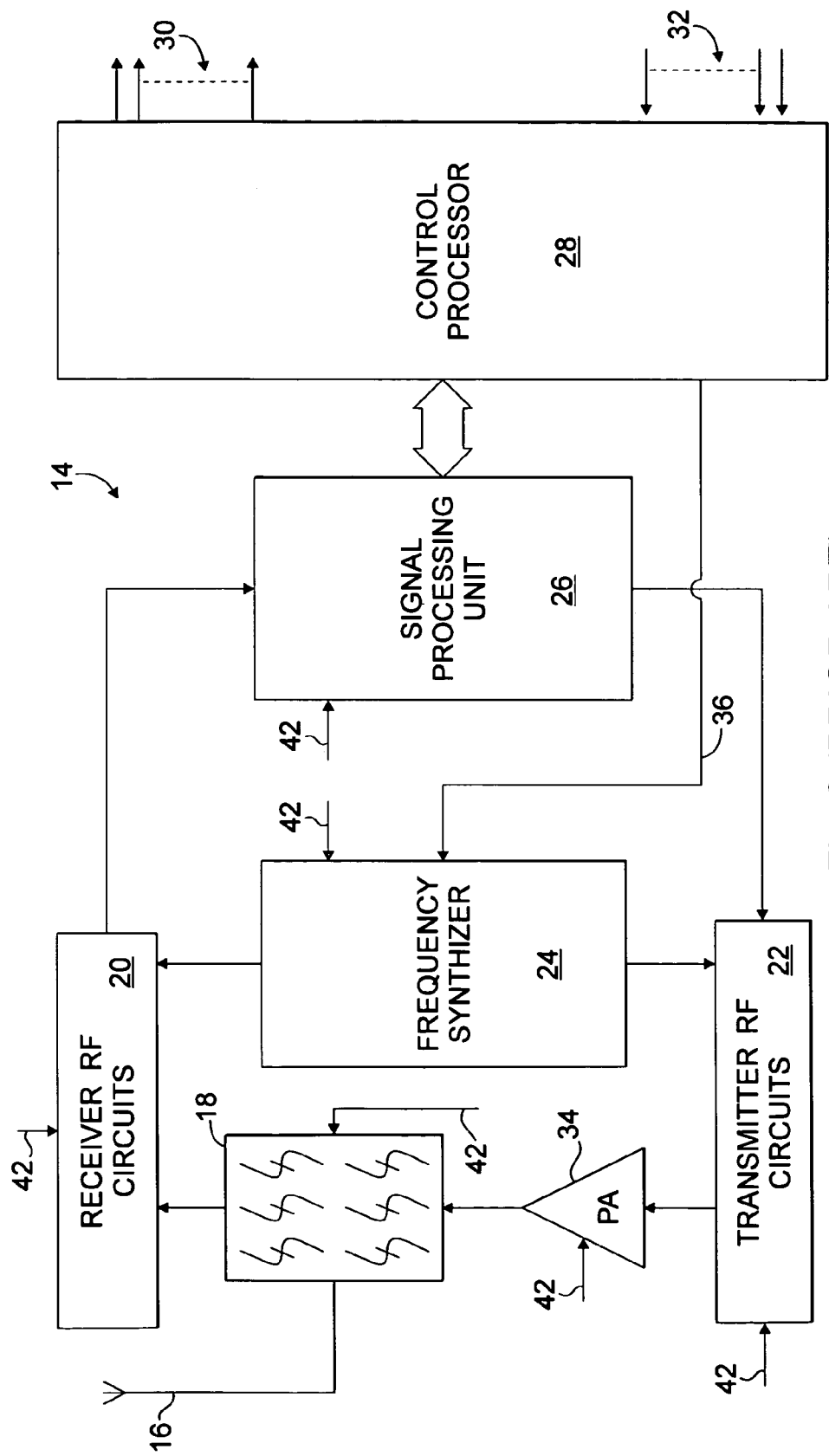
FIG. 2 is a block circuit diagram of a conventional cellular phone.

FIG. 2 is a block circuit diagram of a conventional cellular phone, shown generally at 14, which may be a simple, single-band phone. The cellular phone 14 includes an antenna 16, a duplexer or T/R switch 18, receiver RF (Radio Frequency) circuits 20, transmitter RF circuits 22, a frequency synthesizer 24, a signal processing unit 26 and a control processor 28. Signals received at the antenna 16 are fed to the receiver RF circuits 20 via the duplexer or T/R switch 18. The signals output by the receiver RF circuits 20 are received by the signal processing unit 26 and conventionally processed. The processed received signals are fed to the control processor 28, which analyzes the signals and directs them, at signal lines 30, to conventional man/machine interface devices (not shown), such as transducers, speakers, visual displays, etc.

Signals for transmission are received at signal lines 32 by the control processor 28. Such signals are generated by conventional man/machine interface devices (not shown), such as transducers, microphones, keypad entry, etc. The signals for transmission are fed to the signal processing unit 26 for conventional processing and then to the transmitter RF circuits 22. A power amplifier 34 amplifies the transmission signals from the transmitter RF circuits 22. The amplified transmission signals are fed to the antenna 16 via the duplexer or T/R switch 18 and transmitted over the cellular, or other wireless, network. The frequency synthesizer 24 receives a frequency control signal 36 from the control processor 28 and conditions the receiver RF circuits 20 and the transmitter RF circuits 22 to receive and transmit, respectively, on selected channel frequencies. The control processor 28 includes both program and data memory and generates conventional control signals 42 received by each of the devices shown in FIG. 2, with the exception of the antenna 16, for controlling operation of the respective device.

In wireless phones using Frequency Division Duplexing (FDD), the duplexer 18 includes duplexing filters permitting the wireless phone to receive and transmit simultaneously. Two examples of wireless phones capable of receiving and transmitting simultaneously include analog FM-AMPS (Advanced Mobile Phone Systems) phones and CDMA (Code Division Multiple Access) phones such as IS95 phones.

In TDMA wireless phones using Time Division Duplexing (TDD), however, the T/R switch 18 is utilized in place of the duplexer to connect the transmitter 22 and receiver 20 RF circuits alternately to the antenna 16. Such alternate transmit and receive connection is possible in TDMA wireless phones since transmission and reception occur in alternate bursts, or time slots, and not simultaneously. Examples of such TDMA/TDD phones include phones operating according to the European GSM (Global System for Mobile Communications) standard, also known in the United States as PCS (Personal Communication Services), and phones operating according to the USTDMA standard known as D-AMPS (Digital Advanced Mobile Phone System) or IS136.

Figure 3:
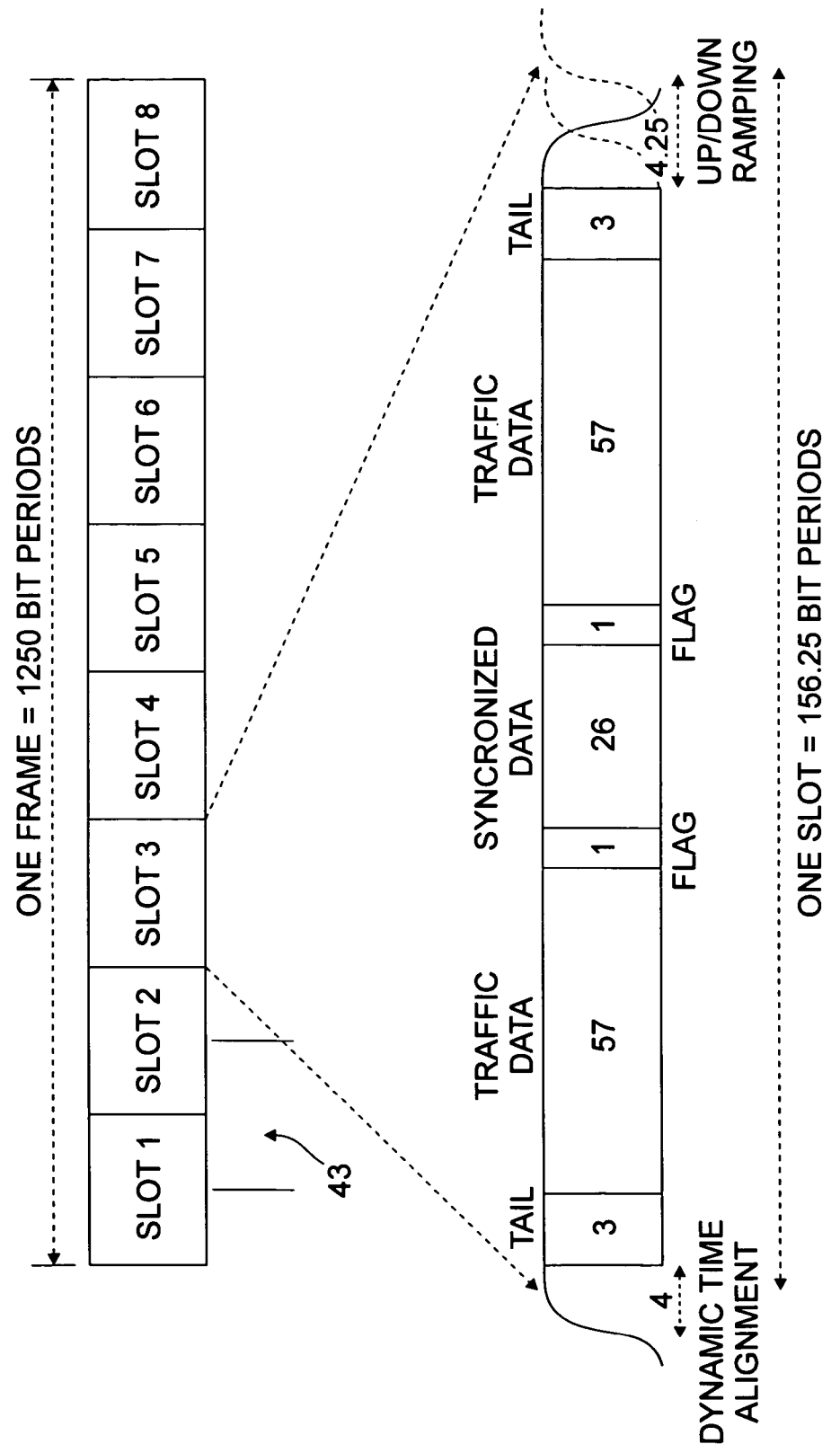
FIG. 3 illustrates a typical Time Division Multiple Access signal waveform frame and slot format.

FIG. 3 illustrates a typical TDMA signal waveform frame and slot format. A full-rate TDMA burst, or frame, includes 1250 symbol or bit periods, which are divided into eight time slots of 156.25 bit periods each. The transmit and receive frame periods for each mobile phone are staggered in time relative to one another, with each transmit and receive frame period occupying one time slot. A gap of 1.5 time slots occurs between each respective receive and transmit time slot, with a gap of 4.5 time slots occurring between each respective transmit and receive time slot. For example, if a mobile phone is allocated transmit slot 4 for transmission, its corresponding allocated receive slot, shown at 43, would occupy the latter half of slot 1 and the beginning half of slot 2, which are used for transmission by different mobile phones. The 1.5 slots of idle time between the respective receive and transmit slots are utilized for actions like changing the channel frequency synthesizer (24 in FIG. 2) from receive to transmit, or changing the T/R switch (18 in FIG. 2) from receive to transmit. When only one transmit and one receive slot is allocated per frame, for example, for a relatively low data rate service such as voice, a gap of 4.5 slots exists between the end of the transmit slot and the next receive slot. So in the example where the mobile phone is allocated slot 4 for transmission, the next receive slot for that particular mobile phone would be in the latter half of slot 1 and the beginning slot of 2 of the next frame. This gap of 4.5 slots is often used for mobile assisted handover measurements, such as momentarily tuning the receiver to a neighboring base station to perform a signal strength assessment to determine when a handoff to that neighboring base station would be appropriate. The division of the waveform into a frame and slot format, and the allocation of different time slots for receiving and transmitting, allows ingenious use of the idle time between the respective receive and transmit slots to simplify the mobile phone or otherwise improve the system performance, thus making TDMA the world's most popular digital cellular standard.

Since the inventive adjustable matching network is configured to rematch the antenna during idle periods when the cellular phone is neither transmitting nor receiving, such rematching may occur during the 1.5 slots of idle time between the receive and transmit slots, or the 4.5 slots of idle time between the transmit and receive slots. However, it is preferred that the rematching occur during the 1.5 slots of idle time between the receive and transmit slots so as not to interfere with any of the handover functions.

FIG. 3 also illustrates the bit placement within a slot, showing slot 3 in expanded exemplary form. Each slot format includes 114 (57+57) bits of traffic data, 2 (1+1) flag bits of control data, 6 (3+3) tail bits to allow the receive filters to ring down and the channel echos to die, and 26 bits of known synchronization data. Each slot format further includes 4 bit periods of dynamic time alignment and 4.25 bit periods of inter-slot guard time where transmitter up/down ramping may take place. As shown in FIG. 3, there is some overlap of the 4.25 bit up/down ramping periods between slots. As previously noted, in the current invention, antenna impedance adjustments maybe made at any time after the 4.25 bits of transmit down ramping and before the next transmit upramping, while avoiding making any adjustments during the slot period allocated for reception. While it is preferred that antenna impedance adjustments be made during the 1.5 slots of idle time between the receive and transmit slots, adjustments may be made at any time during the idle periods without departing from the spirit and scope of the present invention. Further, while the inventive adjustable matching network is described herein for use in a TDMA system, the inventive adjustable matching network may be utilized in any communications system having idle periods where the mobile device is neither receiving nor transmitting.

The principle aim of the present invention is to obtain a near perfect impedance match for transmission in order to improve transmitter linearity without the use of isolators. This is particularly important when high order symbol constellations, such as linear 8-PSK (Phase Shift Keying), are used. Since it is difficult to measure a mismatch in the receive state, providing independent antenna tuning for reception in a receive frequency band different than the transmit frequency band requires a determination of the receive tuning codes based on the adaptively determined transmit frequency codes, or else a set of fixed receive frequency codes must be predetermined. Further, changing transmit codes between transmit and receive states requires continual operation of the various switch-tuned components at least twice per TDMA frame period. Such continual switching at this rapid rate can result in switch longevity concerns. While at the present time MEMs are demonstrating impressive longevity in rapid switching applications, such frequent switching is avoided in the preferred implementation of the present invention.

Figure 4:
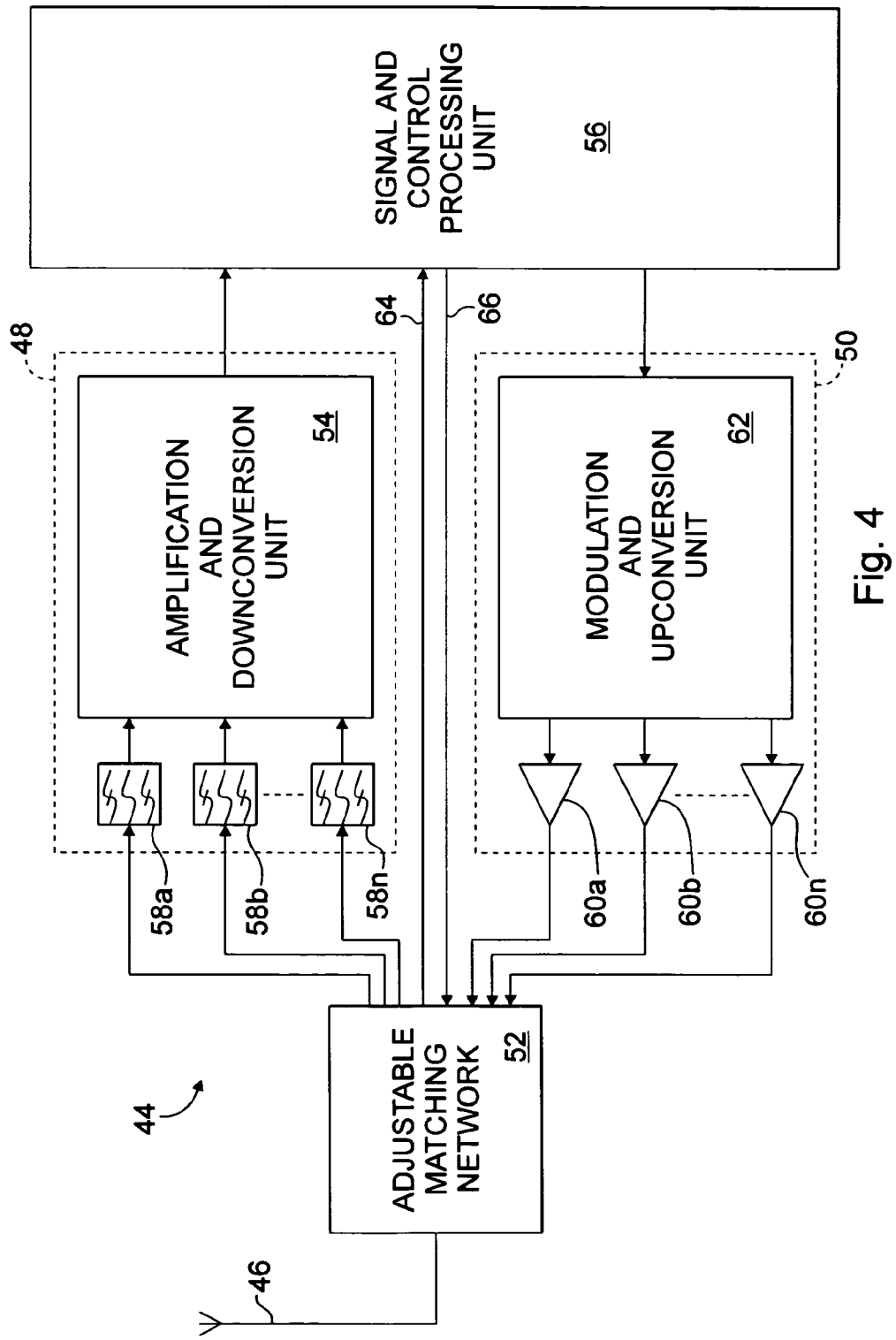
FIG. 4 illustrates antenna coupling arrangements for a wireless communications device incorporating a generic embodiment of the inventive adjustable matching network.

FIG. 4 illustrates the antenna coupling arrangements for a multi-band wireless phone, shown generally at 44, according to the present invention. The multi-band wireless phone 44 includes an antenna 46 connected to receiver 48 and transmitter 50 circuits via an adjustable matching network 52. The receiver circuit 48 includes a conventional multi-band low-noise RF amplification and downconversion unit 54 which converts a signal on a selected channel frequency to a suitable form for processing by a signal and control processing unit 56. Such suitable forms may include (I,Q) complex samples in Cartesian format or (LogR, Theta) samples in logpolar format. The complex (I,Q) samples may be produced, for example, by a homodyne receiver as further described in the following U.S. Patents, the disclosures of which are hereby incorporated by reference herein: U.S. Pat. No. 5,241,702 "D.C. Offset Compensation in a Radio Receiver"; U.S. Pat. No. 5,614,904 "Balance Companed Delta Conversion for Homodyne Receiver"; U.S. Pat. No. 5,568,520 "Slope Drift and Offset Compensation in Zero-IF Receivers"; and U.S. Pat. No. 5,749,051 "Compensation for Second Order Intermodulation in a Homodyne Receiver".

A receiver capable of producing downconverted complex samples in logpolar format is described, for example, by combining the teachings of the following U.S. Patents, the disclosures of which are hereby incorporated by referenced herein: U.S. Pat. No. 5,048,059 "Log-Polar Signal Processing"; U.S. Pat. No. 5,070,303, "Logarithmic Amplifier/Detector Delay Compensation"; and U.S. Pat. No. 5,084,669 "Direct Phase Digitization".

The receiver circuit 48 also includes a plurality of bandpass filters 58a, 58b, . . . 58n for each of the receive frequency bands in which operation is required. Each bandpass filters 58a–n has an input that is connected to the antenna 46 by the adjustable matching network 52 whenever the mobile phone 44 is receiving a signal in the respective frequency band. The amplification and downconversion unit 54 is conventionally conditioned to select a corresponding filter signal output for downconversion.

The transmitter circuit 50 includes a plurality of power amplifiers 60a, 60b, . . . 60n for amplifying signals upconverted to the respective transmit frequency band by a conventional modulation and upconversion unit 62. While FIG. 4 illustrates a separate power amplifier for each of the n transmit frequency bands, fewer than n power amplifiers may be used if two transmit frequency bands are sufficiently close to be serviced by a single broadband power amplifier. When transmission on a channel frequency in a particular transmit frequency band is selected, the respective power amplifier 68a –n for that band is connected to the antenna 46 by the adjustable matching network 52. Also, the modulation and upconversion unit 62 is conventionally conditioned to generate a drive signal to the respective power amplifier 68a–n at the selected channel frequency.

Both the receiver 48 and transmitter 50 circuits may be conditioned to receive or transmit on selected channel frequencies by control signals, such as frequency synthesizer tuning signals, from the signal and control processing unit 56 via a control bus (not shown). Such a control bus may include an I²C bus which is a known standard in the art. Further details of modulation and channel frequency generation for multi-band wireless phones may be found in the following U.S. Patents and Applications, the disclosures of which are hereby incorporated by reference herein: U.S. Pat. No. 5,530,722 "Quadrature Modulator with Integrated Distributed RC Filters"; U.S. Pat. No. 6,009,312 "Transmit Signal Generation with the Aide of a Receiver"; U S. Pat. No. 5,890,051 "On-Channel Transceiver Architecture in a Dual Band Mobile Phone"; and U.S. patent application Ser. No. 08/974.227 "Simplified Reference Frequency Distribution in a Mobile Phone" to Gore, Dolman and Dent, filed Nov. 19, 1997, and assigned to the Assignee of the present application.

The adjustable matching network 52 may incorporate both the T/R switching function or the duplexing function of connecting the transmitter 50 and receiver 48 circuits to the antenna 46 in such a way to avoid interference or signal loss. In addition, the adjustable matching network 52 incorporates the function of selecting the transmit or receive frequency band for which the antenna 46 is operative. As will be described later in the application, the adjustable matching network 52 performs measurements on the transmitted signals and generates mismatch indication signals on line 64. These mismatch indication signals 64 are received by the signal and control processing unit 56 which, in turn, generates matching network control signals on line 66 which are received by the adjustable matching network 52 and used to match the antenna 46 to a selected frequency band. Thus, the adjustable matching network 52 may adjust the impedance of the antenna 46 to provide a desired impedance match for each different frequency band when selected for operation.

Figure 5:
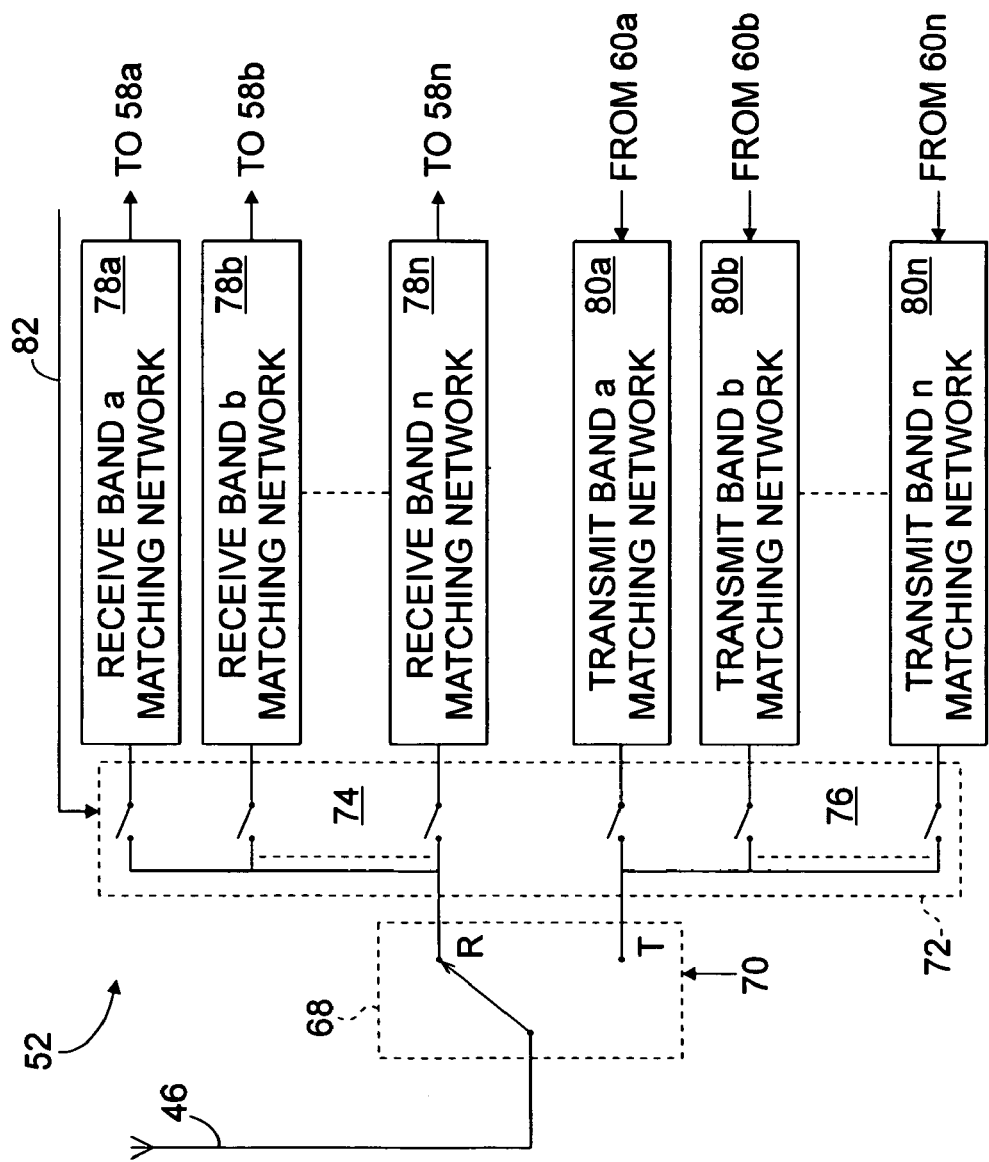
FIG. 5 is a circuit arrangement for a first embodiment of the adjustable matching network shown in FIG. 4.

FIG. 5 illustrates a circuit arrangement for the adjustable matching network 52 shown in FIG. 4. The adjustable matching network 52 includes a T/R switch 68 made using conventional switch technology (i.e., PIN diode or GaAs). The T/R switch 68 is controlled by the signal and control processing unit 56 via a control signal 70 to connect the antenna 46 to either the receiver 48 or transmitter 50 circuits at appropriate times during the TDMA frame period. The T/R switch 68 therefore operates at the TDMA frame rate. The adjustable matching network 52 also includes a bank of switches 72 divided into upper 74 and lower 76 banks for receiving and transmitting, respectively. The upper bank of switches 74 is connected to the receive contact of the switch 68, while the lower bank of switches 76 is connected to the transmit contact of the T/R switch 68. Each switch in the upper bank of switches 74 is connected to a respective receive band matching network 78a, 78b, . . . 78n which is configured to optimize the antenna impedance matching for that particular receive frequency band. Similarly, each switch in the lower bank of switches 76 is connected to a respective transmit band matching network 80a, 80b, . . . 80o which is configured to optimize the antenna impedance matching for that particular transmit frequency band.

When the T/R switch 68 connects the antenna 46 to the receiver circuit 48, the upper bank of switches is 74 is used to select the appropriate receive frequency band. Similarly, when the T/R switch 68 connects the antenna 46 to the transmitter circuit 50, the lower bank of switches 76 is used to select the appropriate transmit band. Band switching by the upper 74 and the lower 76 bank of switches is controlled by a band selection signal 82 received from the signal and control processing unit 56. Since band switching occurs much less frequently than T/R switching, the bank of switches 72 includes electromechanical switches, such as MicroElectronic Machines (MEMs). None of the MEMs in the bank of switches 72 need operate at the T/R switching rate of the T/R switch 68, as the selection of a receive band is decoupled from the selection of a transmit band and it is not necessary to deselect the received band when selecting the transmit band, and vice-versa.

Since the plurality of switches 72 separate the receive and transmit frequency bands into different wires, the receive matching networks 78a–n and the transmit matching networks 80a–n may be utilized to optimize the antenna impedance matching for each receive and transmit frequency band independently and separately. If the antenna 46 presents a good match already at any frequency band, the associated matching network may simply include a null network. In other cases, the matching network may simply include an appropriate length of stripline of an appropriate impedance. Each matching network will typically not be more complicated than a single series inductor and a shunt capacitor. Such an arrange can theoretically match any impedance to the desired value, e.g., 50 ohms, over each relatively narrow transmit or receive frequency band. Such matching networks maybe integrated, for example, as spiral inductors and capacitors consisting of the deposited metalization on an insulating substrate, such as Gallium Arsenide, Alumina or Silicon Dioxide, on which the MEM switches 72 and the T/R switch 68 may also be constructed to form a single component.

As previously discussed, further longevity testing of MEM devices may confirm their suitability for T/R switching at the TDMA frame rate. However, conservative design approaches continue to employ traditional PIN-diode or GaAs RF switch technology for the T/R switch 68. Band switching and adaptive matching adjustments typically occur much less frequently and, accordingly, an MEM device may be used for these switching function with less risk of failure due to wear. If electromechanical latching relays could be produced in a sufficiently small size, they may be utilized as an alternative to the MEM devices. However, in the present state of the art, MEM technology is the most promising method to manufacture a sub-miniature electromechanical switch.

Figure 6:
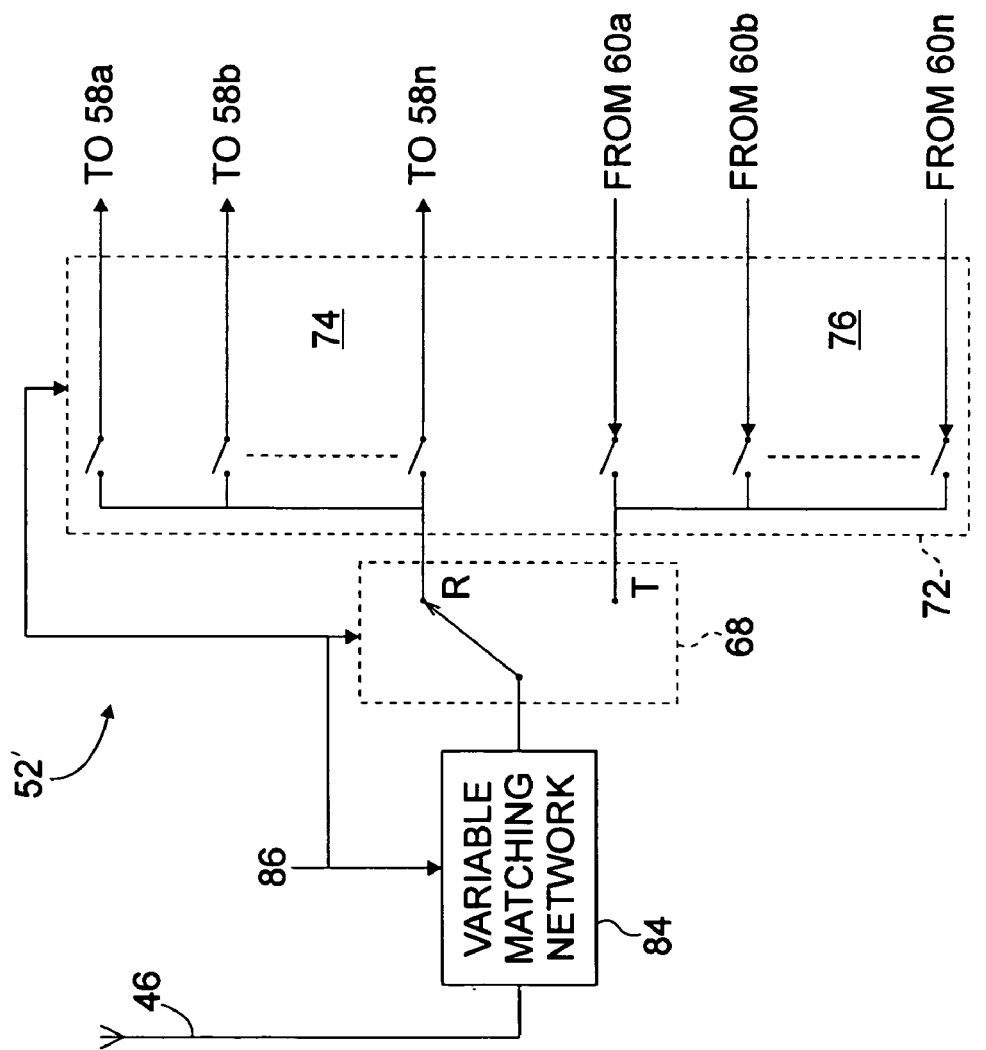
FIG. 6 is a circuit arrangement for a second embodiment of the inventive adjustable matching network shown in FIG. 4.

In the adjustable matching network 52 FIG. 5, the receive 78a–n and transmit 80a–n matching networks must be customized to a particular antenna and mobile phone combination Even if the same particular antenna is utilized on a different mobile phone, the impedance matching Characteristics of each matching network may need to be different. Thus, the manufacturing volume of the particular design of FIG. 5 may be restricted to the manufacturing volume of the particular mobile phone and antenna combination. To increase the volume over which non-recurring costs are recovered, it would be desirable to utilize the same antenna coupling circuitry for more than one antenna and mobile phone combination. FIG. 6 illustrates such an arrangement with like elements of FIG. 5 indicated with the same reference number.

FIG. 6 illustrates a second embodiment of the adjustable matching network, shown generally at 52'. The adjustable matching network 52' includes a variable matching network 84 connected between the antenna 46 and the T/R switch 68. The bank of switches 72 is connected to the T/R switch 68 in the same manner as previously described with respect to FIG. 5. However, the receive 78a–n and the transmit 80a–n matching networks of FIG. 5 are removed and each of the switches in the upper bank of switches 74 is connected directly to its respective band filter 58a–n and, similarly, each of the switches in the lower bank of switches 76 is connected to its respective power amplifier 60a–n. Control signals 86 from the signal and control processing unit 56 operate the I/R switch 68 at the TDMA frame rate, but operate the bank of switches 72 and the variable matching network 84 only when changing frequency bands. Although it is possible to alter the variable matching network 84 between transmit and receive states, this would require the switches therein to operate at the TDMA frame rate. To avoid such rapid switching, the variable matching network 84 is set to a state that impedance matches the antenna 46 at both the transmit and the receive frequency bands of a band pair. In this particular implementation, cross-band operation is not possible. Cross-band operation occurs when the mobile phone transmits at a frequency in a transmit band of a first band pair but receives at a frequency in a receive band of a second band pair. In contrast, cross-band operation is possible with the implementation shown in FIG. 5, as the selection of the transmit and receive frequency bands and associated matching networks are independent of one another. However, the advantage of the adjustable matching network 52' shown in FIG. 6 is that the variable matching network 84 can function for a range of antenna and mobile phone types, since the matching control signals 86 from the signal and control processing unit 56 can be customized by software implementation for a particular case.

Figure 7:
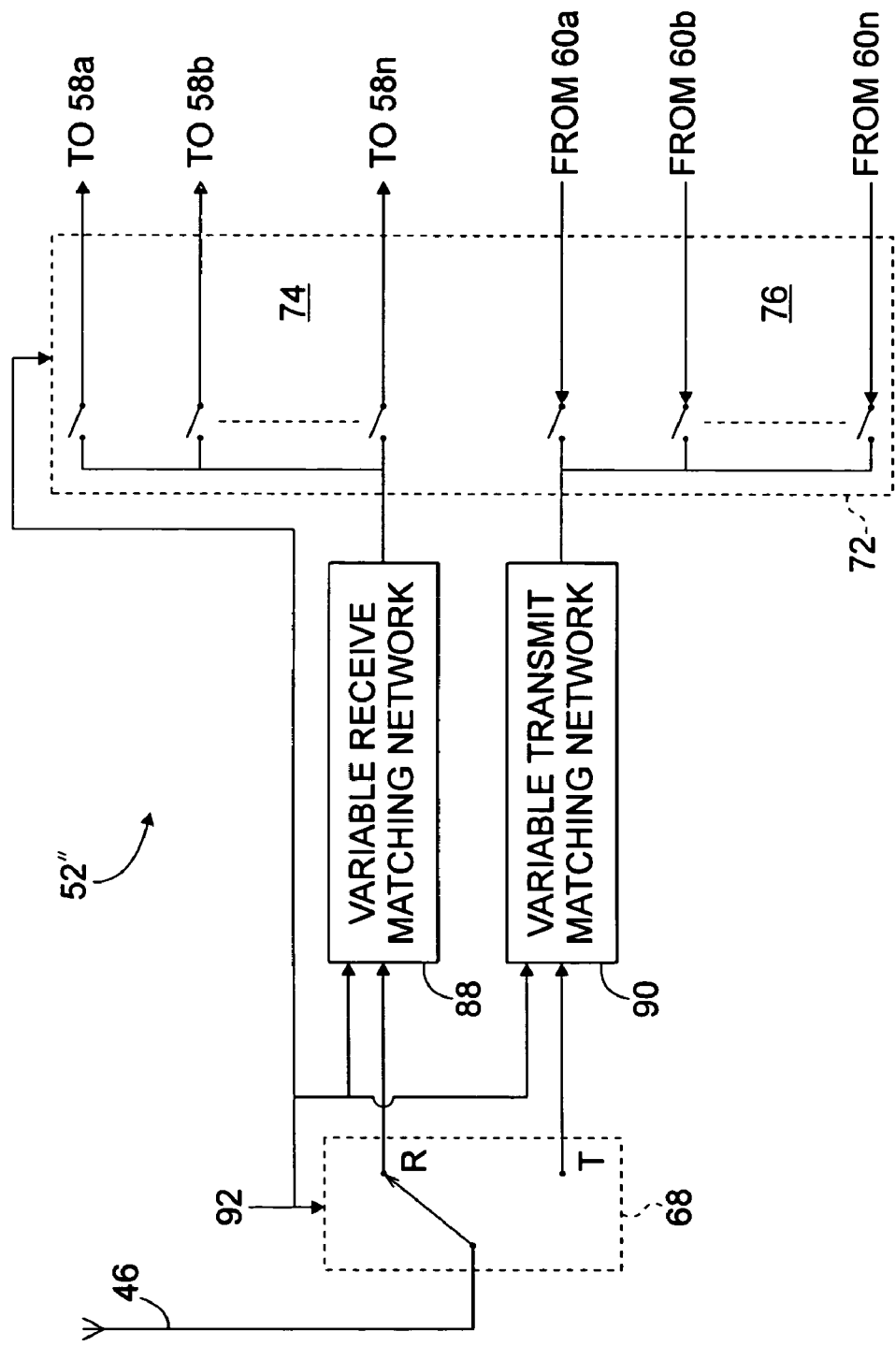
FIG. 7 is a circuit arrangement for a third embodiment of the inventive adjustable matching network shown in FIG. 4.

FIG. 7 illustrates a third embodiment of the adjustable matching network, shown generally at 52", that permits cross-band operation. The adjustable matching network 52" includes separate variable receive 88 and transmit 90 matching networks for matching the receiver separately from the transmitter. The T/R switch 68 is connected to the antenna 46, with the variable receive matching network 88 connected to the receiver contact of the T/R switch 68, and the variable transmit matching network 90 connected to the transmit contact of the T/R switch 68. The variable receive matching network 88 is connected to the upper bank of switches 74 to match the antenna 46 to the appropriate receive band filter 58a–n. Similarly, the variable transmit matching network 90 is connected to the lower bank of switches 76 for matching the antenna 46 to the appropriate power amplifier 60a–n. Thus, the selection of the transmit band and the receive band are independent, permitting cross-band operation without the need to alter either matching network 88 or 90.

Impedance matching control signals 92 are provided from the signal and control processing unit 56 to operate the T/R switch 68 at the TDMA frame rate, but operates the bank of switches 72 and the variable receive 88 and transmit 90 matching networks to change only when the selection of the operating frequency band changes. This occurs at a relatively slow rate such as when the mobile phone 10 (See FIG. 1) crosses the boarders between base stations 11a,11b and base stations 12a,12b, and thus places no undue stress on the longevity of the matching network switches included within each variable matching network 88 and 90.

It is sometime sufficient to use only the variable transmit matching network 90 and omit the variable receive matching network 88, since the deleterious effects of imperfect antenna match on the receiver performance is much less severe than on the transmitter performance. Generally, the only effect of antenna mismatch on the performance of the receiver is on its thermal noise figure, which may not be significant in an interference limited cellular scenario. Further, since mobile phones are typically battery operated, they should transmit at a high efficiency to conserve battery power. Such high transmit efficiency is facilitated by insuring good transmitter impedance match. Such concerns typically do not apply to base stations since they will have transmit power in reserve.

One of the deleterious effects of antenna mismatch on transmission characteristics concerns transmitter linearity. A saturated (i.e., non-linear, constant-envelope of class-C power amplifier) transmitter may deliver reduced or increased power into a mismatched antenna, depending on the particular direction of the mismatch. If the power delivered by the transmitter is increased, the base station may detect that the signal received by it is luxurious and may send a command to the mobile phone instructing the mobile phone to reduce its power. This detection and correction at the base station partly compensates for antenna mismatch and helps to maintain the battery life of the mobile phone. However, when linear modulations are used for improved spectral efficiency or other reasons, as is essential in CDMA systems, antenna mismatch may cause the power amplifier to become non-linear when the instantaneous power level is well below the desired peak power level of the modulation. Unless this non-linearity is detected and corrected, interference with other stations may result. One prior art method of isolating linear power amplifiers from antenna mismatch is to include an isolator between the power amplifier and the antenna. However, isolators are narrowband devices, physically large in size and generally expensive. One isolator would be required for each frequency band, thus making it difficult to incorporate them in mobile phones where size is a concern. The adjustable matching network of the present invention eliminates the need for per-band isolators while using variable mashing networks to insure a good power amplifier impedance match in order to preserve the power amplifier linearity.

Figure 8:
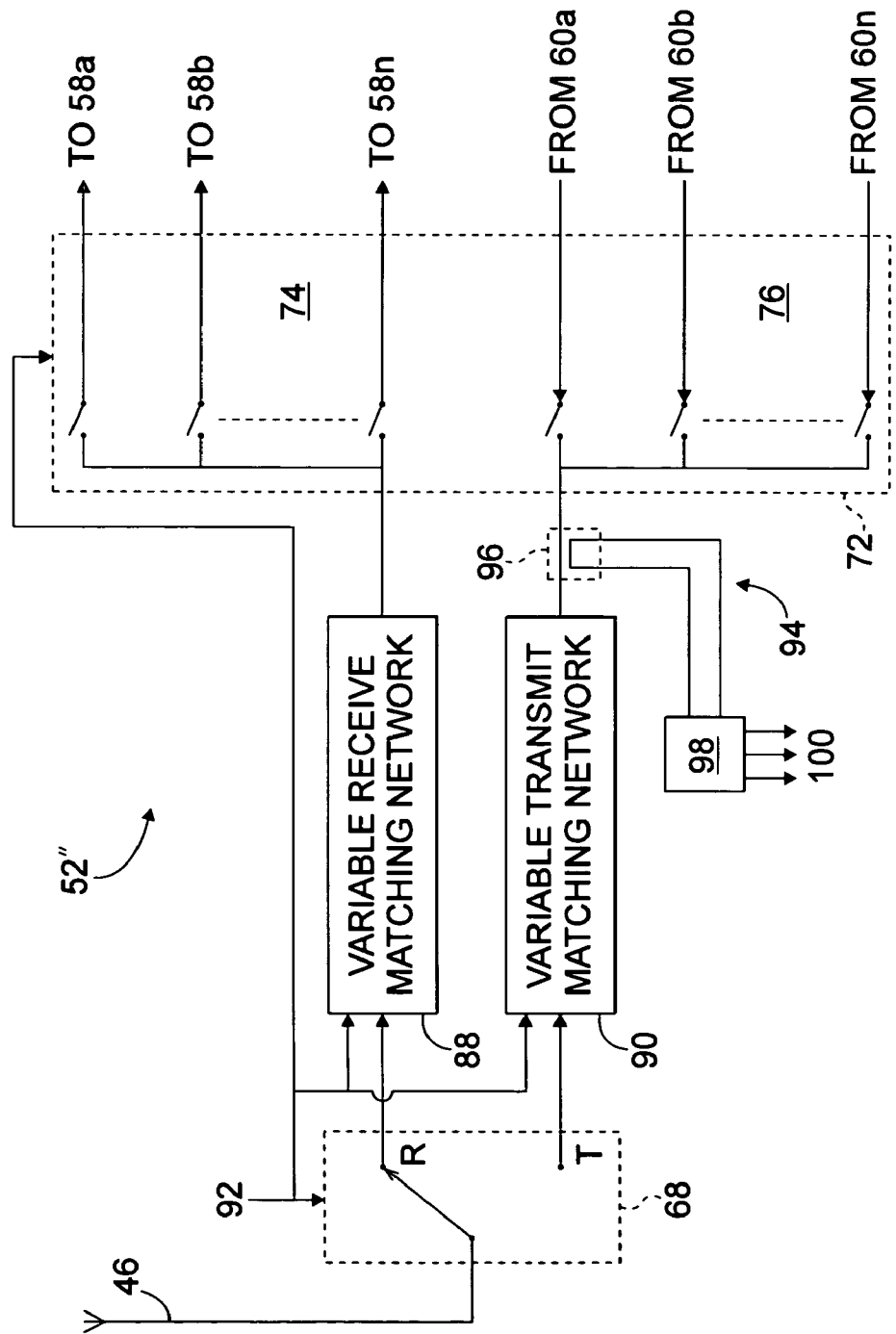
FIG. 8 is a circuit arrangement illustrating the addition of an impedance mismatch measuring and quantizing unit to the inventive adjustable matching network shown in FIG. 7.

To facilitate adjustment of the variable transmit matching network 90, FIG. 8 shows the addition of an impedance mismatch measuring and quantizing unit 94 to the adjustable matching network 52" of FIG. 7. The impedance mismatch measuring and quantizing unit 94 includes a directional coupler 96 measuring the forward and reflected power of the transmitted signal, and a detection and quantizing unit 98 receiving the forward and reflected power measurements and generating signals 100 providing a coarsely quantized indication of antenna impedance mismatch. The impedance mismatch measuring and quantizing unit 94 should operate on all frequency bands if placed between the variable transmit matching network 90 and the bank of switches 72, as shown in FIG. 8. However, if this is difficult, separate impedance mismatch measuring and quantizing units 94 may be located between the lower bank of switches 76 and the respective power amplifier 60a–n.

The impedance mismatch of the antenna need not be measured accurately in order to be able to adjust the variable transmit matching network 90 appropriately. The impedance mismatch need only be quantized into the values "good enough" or "not good enough", with the latter "not good enough" value further quantized into one of four regions indicating where on a Smith chart the impedance mismatch lies.

Figure 9:
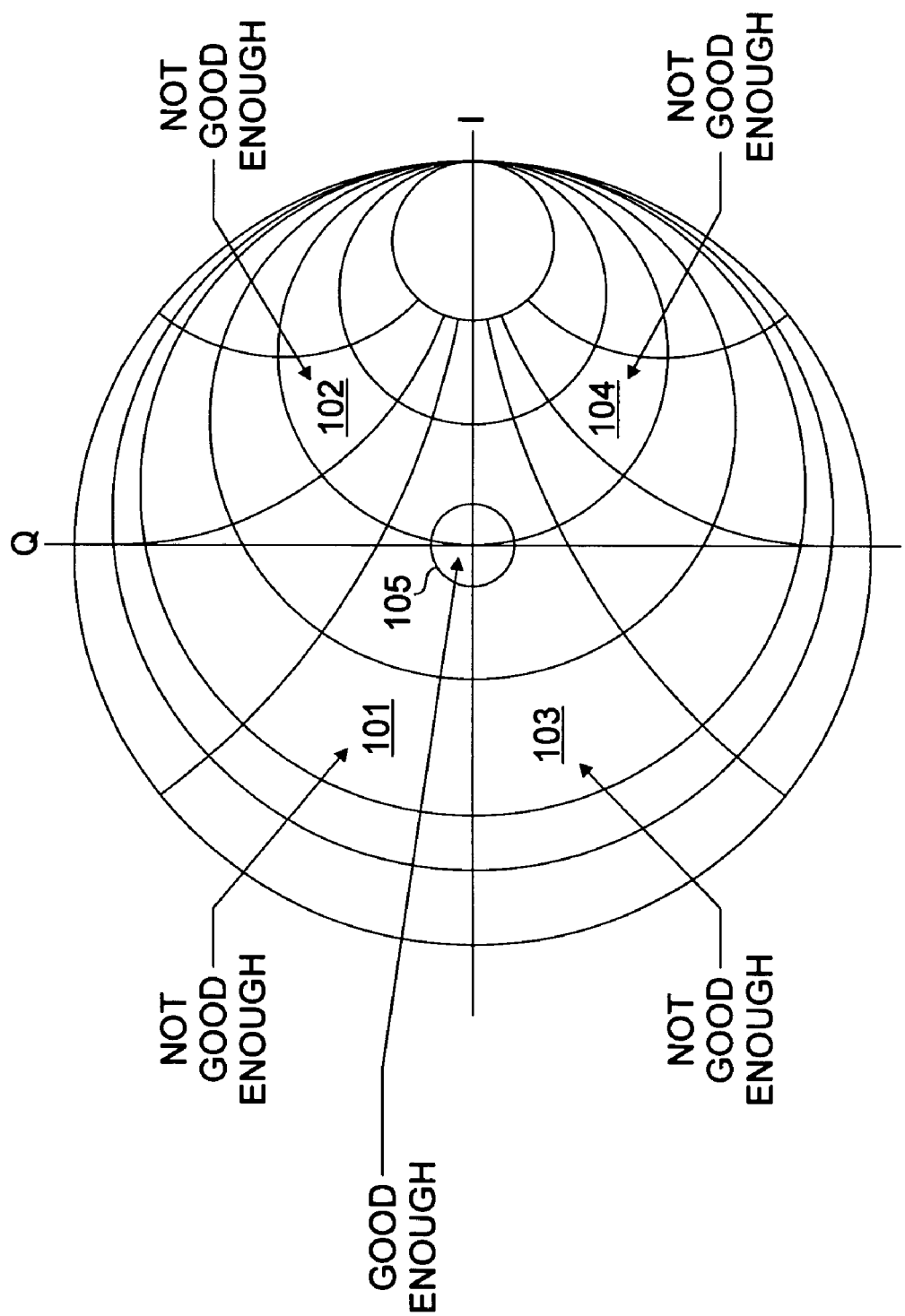
FIG. 9 is a graph of a Smith chart divided into five regions corresponding to four "not good enough" regions, and one "good enough" region for antenna mismatch.

FIG. 9 is a graph of a Smith chart divided into five regions corresponding to four "not good enough" regions, 101, 102, 103, 104, and a "good enough" region 105 in the center of the chart defined by the circle. The circle defining the "good enough" region 105 corresponds to a reflection coefficient of 0.1, or –20 dB, or a VSWR of 1.2, which has been postulated to be good enough for most cellular applications. The remainder of the Smith chart outside the "good enough" region 105 is classified into the four "not good enough" quadrants, which correspond respectively to the negative real parts of the reflection coefficient (regions 101 and 103); the positive real parts of the reflection coefficient (regions 102 and 104); the negative imaginary parts of the reflection coefficient (regions 102 and 101); and the positive imaginary parts of the reflection coefficient (regions 103 and 104).

To quantize the impedance match or mismatch into these five regions 101–105, the reflectived power signal may be connected to a signal input of a quadrature demodulator (not shown in FIG. 8) (i.e., two balanced mixers driven in quadrature with a local oscillator), with the forward power signal used as the local oscillator. The signs of the DC output from the respective demodulators would then indicate the quadrant of the Smith chart of FIG. 9 in which the impedance mismatch lies. The magnitude of the reflected power signal relative to the magnitude of the forward power signal indicates whether the impedance match is "good enough" or "not good enough". For most cellular applications, if the reflected power signal magnitude is less then ten-percent of the forward power single magnitude, the match is typically considered "good enough". Such a determination can be made by utilizing a 10:1 potentiometer step down to place ten-percent of the rectified forward power signal on one input of a comparator with the rectified reflected power signal on the other input of the comparator. The comparator output of "1" or "0" will then provide the desired indication of whether the reflected power is less then ten-percent of the forward power.

The impedance mismatch measuring and quantizing unit 94 shown in FIG. 8 provides a 3-bit output signal 100 to the signal and control processing unit 56. If the "good enough/not good enough" indication signal indicates that the match is "good enough", then the reflection coefficient lies within the "good enough" region (105 in FIG. 9), and the signal and control processing unit 56 makes no change to the variable transmit matching network 90. On the other hand, if the mismatch indication signal indicates that the match is "not good enough", the signal and control processing unit 56 will operate one or more matching network switches to effectuate a least significant change to the reactance of the one or more matching network switches. The sign of the change in reactance to the one or more matching network switches is given by the region of the mismatch.

For example, referring to FIG. 9, if the mismatch falls in regions 103 or 104, a first reactance will be operated to decrease the capacitive part of the impedance; while if the mismatch falls in regions 101 or 102, the first reactance will be operated to increase the capacitive part of the impedance. Similarly, if the mismatch falls in regions 101 or 103, a second reactance placed so as to effect the real part of the impedance (reflection coefficient) is operated to increase the real part of the impedance; while if the mismatch falls in regions 102 or 104, the second reactance will be operated to decrease the real part of the impedance. Due to the coarse quantizing into the five regions, 101–105, it cannot be known by how much the reactance should be changed to achieve a match in the good enough region 105. However, by making only a least significant change to the respective reactance, the matching can slowly be walked into the "good enough" region 105, at which points reactance adjustments stop.

In an exemplary embodiment, the frequency at which reactance adjustments are made is limited to once per TDMA frame, with the adjustments based on classifying the average reflection coefficient over the entire transmit frame. Further, the adjustments are made only when the mobile phone is not transmitting, and preferably while not receiving either, in order to avoid potentially interfering glitches. If desired, the adjustments may also be limited to being made less frequently than once per TDMA frame, e.,g., once per 100 ms, by using the signal and control processing unit 56 to determine the average mismatch region over several frames.

The previously converged matching switch control signals will also be stored in a non-volatile memory, such as an EEPROM, in a table versus operating frequency. These values may be recalled as initial values whenever transmission on a previously used operating frequency occurs. Further, these saved values may also be used whenever a power amplifier is operated at significantly less there its maximum operating power level. During such operation, adjustments may be suspended. Adjustment suspension is permissible during lower power operation because linear power amplifiers are degraded less by mismatching when operated at less then maximum power. The impedance mismatched measuring and quantizing unit 94 shown in FIG. 8 need only operate when maximum power is selected, thus reducing the sensitivity required thereby.

Figure 10:
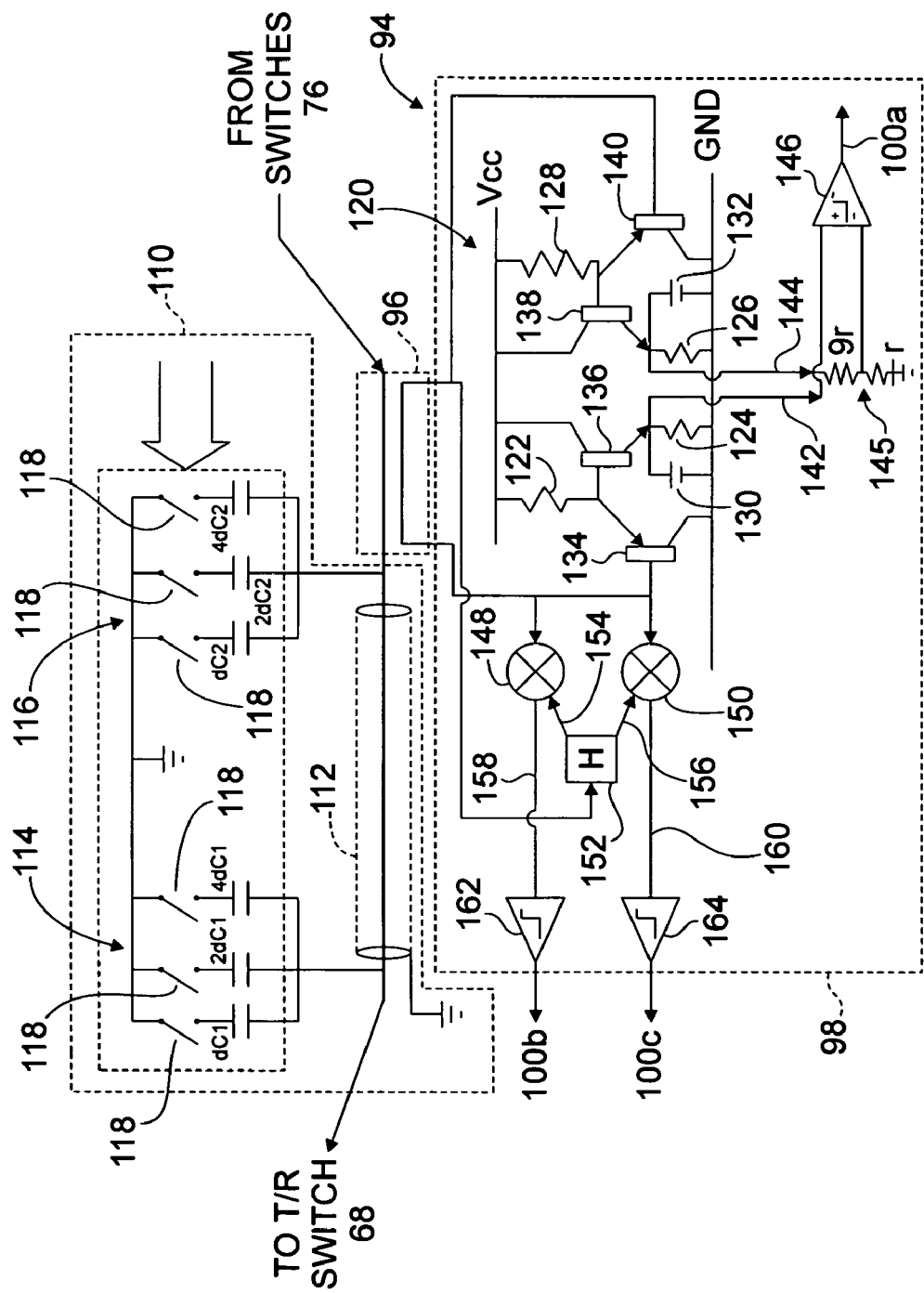
FIG. 10 is a circuit diagram of the impedance mismatch and quantizing unit shown in FIG. 8.

FIG. 10 is a circuit diagram of the directional coupler 96 and the detection and quantizing unit 98 shown in FIG. 8. FIG. 10 also shows an exemplary circuit diagram of a variable matching network 110. The variable matching network 110 shown in FIG. 10 may be utilized for any of the matching networks previously described namely, adjustable matching network 52, variable matching network 84, variable receive matching network 88, and variable transmit matching network 90.

The exemplary variable matching network 110 includes a lengtht L of transmission line 112 having a characteristic impedance Zo with first 114 and second 116 capacitor banks attached to ground at either end of the transmission line 112. When the characteristic impedance Zo of the transmission line 112 is greater than the target matched impedance (e.g., 50 ohms) and its length L is less then one quarter wavelength, its influence is similar to that of a series inductance, and hence the network is operable similar to a Pi-network.

Each of the first 114 and second 116 capacitor banks includes three parallel connected capacitors connected to ground via respective switches 118, with each capacitor having its own switch 118. The first bank of capacitors 114 is in a binary ratio of dC1:2dC1:4dC1, where dC1 represents a minimum change in capacitance. Similarly, the second bank 116 of capacitors is in a binary ratio of dC2:2dC2:4dC2, where dC2 is also a minimum change in capacitance. Thus, the capacitance associated with the first 114 and the second 116 capacitor banks is variable from 0 to 7dC1 and from 0 to 7dC2, respectively, upon operating the respective switches 118 associated with each capacitor with two of the three bit binary control signals 100 received at the signal and control processing unit 56. MEM devices are the preferred type of switch utilized for the switches 118, as they can be integrated on the same substrate as the switched capacitors, the transmission line 112, and other optional semi-conductor components. However, PIN-diodes or relays could also be utilized.

The directional coupler 96 samples the forward and reflected power signals and rectifies the both using an infinite-impedance detector 120 connected between a control voltage Vcc and ground. The infinite-impedance detector is configured as shown in FIG. 10 and includes resistors 122, 124, 126 and 128, capacitors 130 and 132, and transistors 134, 136, 138 and 140. The sampled forward power signal is input to the control terminal of the transistor 140, while the sampled reflected power signal is input to the control terminal of the transistor 134. The detected reverse power is taken from the output terminal of the transistor 136 at line 142, and the detected forward power is taken from the output terminal of the transistor 138 at line 144. The detected forward power signal on line 144 is input to a 10:1 voltage splitting network 145, and the reverse power signal amplitude on line 142 is compared with one-tenth of the detected forward power signal by a comparater 146. The comparator 146 outputs a "good enough/not good enough" decision signal 100a to the signal and control processing unit 56 indicative of whether or not the mismatch lies within the good enough region 105 shown in FIG. 9.

The reflected power signal is also applied to a signal input of balanced mixers 148 and 150, which are driven in quadrature at their local oscillator inputs by the forward power signal. A 90-degree phase splitter, or Hilbert network, 152 splits the forward power signal with a 90° phase difference and inputs the 90° split forward power signals 154 and 156 to the mixers 148 and 150 to drive them in quadrature. The mean dC output signals 158 and 160 from the balanced mixers 148 and 150, respectively, averaged over a TDMA transmit frame are input to comparators 162 and 164 respectively, which quantize the results as either a plus (+) or a minus (−), with their respective output signal 100b and 100c fed to the signal and control processing unit 56. Quantizing in this manner establishes in which of the four quadrants 101–104 of FIG. 9 the mismatch lies. This is sufficient for the signal and control processing unit 56 to determine, based on preprogrammed rules, whether to increase or decrease the capacitance C1 or C2, or both, by a minimum step of dC1 or dC2, respectively. The preprogrammed rules insure that the decided action always results in a movement of the impedance mismatch toward, and ultimately into, the "good enough" region 105 of FIG. 9.

The preprogrammed set of rules is but one of a preset number of all possible sets of rules. The number of possible sets of rules is determined by selecting one of the possible actions (−dC1, 0, dC1) combined with (−dC2, 0, dC2) for a total of nine possible actions for each of the four regions 101–104, and for each of the sixty-four ($2^6$) possible pre-existing switched to capacitor states results in a total of 64×9⁴ sets of rules. The selection of one of these sets of rules is independent of the choice of antenna or mobile phone, and can be determined by simulation techniques. The 64×4 values of the decided capacitance changes can be combined with the pre-existing (1 of 64) capacitor switch states to determine the new capacitor snitch state after the change, with the six switch control bits required to program the switch state stored in a 256-byte look-up table. One such table would be required for each frequency band in which operation of the mobile phone is desired.

The entire detection and quantizing unit 98 as shown in FIG. 10 can be constructed as a single silicon chip, or else it may be integrated into the transmit signal generator and modulator chip part of the transmitter circuits 50 (see FIG. 4). Likewise, the variable matching network 110, including the switches 118, can be integrated with the bank of MEM switches 72 to reduce the number of different chips or modules.

For more information on MicroElectronic Machines, reference is made to the following U.S. Patents, the disclosures of which are hereby incorporated by reference herein: U.S. Pat. No. 6,057,520 "Arc Resistant High Voltage Micromachined Electrostatic Switch"; U.S. Pat. No. 6,023,121 "Thermal Arched Beam Microelectromechanical Structure"; U.S. Pat. No. 5,994,816 "Thermal Arched Beam Microelectromechanical Devices and Associated Fabrication Methods"; U.S. Pat. No. 5,962,949 "Microelectromechanical Positioning Apparatus"; and U.S. Pat. No. 5,955,817 "Thermal Arched Beam Microelecromechanical Switching Array".

It has been disclosed herein how a mobile phone can be advantageously constructed to operate in multiple frequency bands, including how to solve the problem of matching the antenna at the multiple frequency bands in which operation of the mobile phones is desired. Disclosed herein is an adaptive matching network that automatically determines a matched antenna load impedance for the transmitter. Based on coarse quantization of the impedance mismatch during a TMDA transmit slot, and modification to the matching components of the adaptive matching network between the transmit slots of a TDMA frame format, impedance matching at several frequencies can be successfully achieved. It should be noted that the present invention is not limited to operation in TDMA networks, but may successfully operate to match the antenna in any network having idle slots where the mobile device is down to transmitting or receiving.

While the present invention has been described with particular reference to the drawings, it should be understood that various modifications could be made without the departing from the spirit and scope of the present invention.

We claim:

1. A wireless communications device for transmitting signals in a first plurality of transmit frequency bands and for receiving signals in a second plurality of receive frequency bands, the wireless communications device comprising:
an antenna for transmitting signals to and receiving signals from a wireless communications network; and
an adjustable matching network selectively connecting the antenna to a select one of a third plurality of transmit power amplifiers corresponding to the first plurality of transmit frequency bands for signal transmission, the adjustable matching network matching an impedance of the antenna to the select one transmit power amplifier.

2. The wireless communications device of claim 1, wherein the adjustable matching network selectively connects the antenna to a select one of a fourth plurality of receive bandpass filters corresponding to the second plurality of receive frequency bands for signal reception, the adjustable matching network matching the impedance of the antenna to the select one receive bandpass filter.

3. The wireless communications device of claim 1, wherein the first plurality of transmit frequency bands is equal to the second plurality of receive frequency bands.

4. The wireless communications device of claim 1, wherein the third plurality of transmit power amplifiers is less than the first plurality of transmit frequency bands, with at least one transmit power amplifier operating in at least two transmit frequency bands.

5. The wireless communications device of claim 1, wherein the adjustable matching network comprises a transmit band matching network for each of the first plurality of transmit frequency bands, each of the transmit band matching networks connected to a respective one of the third plurality of transmit power amplifiers and selectively connectable to the antenna, wherein each of the transmit band matching networks are configured to optimize antenna impedance matching for its corresponding transmit frequency band.

6. The wireless communications device of claim 2, wherein the adjustable matching network comprises a switch selectively connecting the antenna to either (a) one of the third plurality of transmit power amplifiers, or (b) one of the fourth plurality of receive bandpass filters, the switch operating during frame periods of a Time Division Multiple Access signal format associated with the wireless communications network.

7. The wireless communications deice of claim 6, wherein the switch comprises either a Gallium Arsenide field effect transistor switch or a PIN diode switch.

8. The wireless communications device of claim 1, wherein the adjustable matching network comprises a first bank of electromechanical switches selectively connecting the antenna to one of the third plurality of transmit power amplifiers, the first bank of electromechanical switches operational to change the antenna selective connection in response to a change in selection of one of the first plurality of transmit frequency bands.

9. The wireless communications device of claim 8, wherein the first bank of electromechanical switches comprise MicroElectronic Machines.

10. The wireless communications device of claim 2, wherein the adjustable matching network comprises a second bank of electromechanical switches selectively connecting the antenna to one of the fourth plurality of receive bandpass filters, the second bank of electromechanical switches operational to change the antenna selective connection in response to a change in selection of one of the second plurality of receive frequency bands.

11. The wireless communications device of claim 10, wherein the second bank of electromechanical switches comprise MicroElectronic Machines.

12. The wireless communications device of claim 5, wherein the transmit band matching networks comprise a single series inductor and a shunt capacitor.

13. The wireless communications device of claim 2, wherein the adjustable matching network comprises a receive band matching network for each of the second plurality of receive frequency bands, each of the receive band matching networks connected to a respective one of the fourth plurality of receive bandpass filters and selectively connectable to the antenna, wherein each of the receive band matching networks are configured to optimize antenna impedance matching for its corresponding receive frequency band.

14. The wireless communications device of claim 13, wherein the receive band matching networks comprise a single series inductor and a shunt capacitor.

15. The wireless communications device of claim 2, wherein the adjustable matching network comprises:
   a variable matching network connected to the antenna; and
   a transmit/receive switch having common, receive output and transmit input terminals, and operable between transmit and receive positions, the transmit/receive switch having its common terminal connected to the variable matching network, the transmit/receive switch receive output terminal selectively connectable to a select one of the fourth plurality of receive bandpass filters, and the transmit/receive switch transmit input terminal selectively connectable to a select one of the third plurality of transmit power amplifiers.

16. The wireless communications device of claim 15, wherein the adjustable matching network further comprises a first bank of electromechanical switches connected between the transmit/receive switch transmit input terminal and the third plurality of transmit power amplifiers for selectively connecting the antenna to a select one of the third plurality of transmit power amplifiers, the first bank of electromechanical switches operational to change the antenna selective connection in response to a change in selection of one of the first plurality of transmit frequency bands.

17. The wireless communications device of claim 15, wherein the adjustable matching network further comprises a second bank of electromechanical switches connected between the transmit/receive switch receive output terminal and the fourth plurality of receive bandpass filters for selectively connecting the antenna to a select one of the fourth plurality of receive bandpass filters, the second bank of electromechanical switches operational to change the antenna selective connection in response to a change in selection of one of the second plurality of receive frequency bands.

18. The wireless communications device of claim 15, wherein the transmit/receive switch is operational at a frame rate of a Time Division Multiple Access signal format utilized by the wireless communications network.

19. The wireless communications device of claim 15, wherein the variable matching network comprises step-switched reactances matching an impedance of the antenna to a selected transmit power amplifier.

20. The wireless communications device of claim 19, wherein the step-switched reactances each comprise a plurality of reactances in a binary ratio of reactance value, with each of the plurality of reactances having an associated switch.

21. The wireless communications device of claim 15, wherein the adjustable matching network further comprises:
   an impedance mismatch measuring and quantizing unit measuring forward and reflected power of a signal transmitted in a selected one of the first plurality of transmit frequency bands corresponding to a selected one of the third plurality of transmit power amplifiers, and generating signals providing a quantized indication of antenna impedance mismatch; and
   a control processing unit receiving and processing the quantized impedance mismatch indication signals and providing adjustment control signals to the variable matching network to adjust the variable matching network to achieve an impedance match of the antenna to the selected transmit power amplifier.

22. The wireless communications device of claim 21, wherein the quantized impedance mismatch indication signals are generated by the impedance mismatch measuring and quantizing unit during a transmit slot of a Time Division Multiple Access frame period.

23. The wireless communications device of claim 21, wherein the control processing unit provides the adjustment control signals to the variable matching network during a portion of a Time Division Multiple Access frame period not used by the wireless communications device for either transmission or reception.

24. The wireless communications device of claim 2, wherein the adjustable matching network comprises:
   a transmit/receive switch having common, receive output and transmit input terminals, and operable between transmit and receive portions, the transmit/receive switch having its common terminal connected to the antenna;
   a variable receive matching network connected to the receive output of the transmit/receive switch and selectively connected to a select one of the fourth plurality of receive bandpass filters; and
   a variable transmit matching network connected to the transmit input terminal of the transmit/receive switch and selectively connected to a select one of the third plurality of transmit power amplifiers.

25. The wireless communications device of claim 24, wherein the adjustable matching network further comprises:
   a first bank of electromechanical switches connected between the variable transmit matching network and the third plurality of transmit power amplifiers for selectively connecting the variable transmit matching network to a select one of the third plurality of transmit power amplifiers, the first bank of electromechanical switches operational to change the selective connection in response to a change in selection of one of the first plurality of transmit frequency bands; and
   a second bank of electromechanical switches connected between the variable receive matching network and the fourth plurality of receive bandpass filters for selectively connecting the variable receive matching network to a select one of the fourth plurality of receive bandpass filters, the second bank of electromechanical switches operational to change the selective connection in response to a change in selection of one of the second plurality received frequency bands.

26. The wireless communications device of claim 25, wherein the first and second banks of electromechanical switches comprise MicroElectronic Machines.

27. The wireless communications device of claim 24, wherein the adjustable matching network further comprises:
   an impedance mismatch measuring and quantizing unit measuring forward and reflected power of a signal transmitted in a selected one of the first plurality of transmit frequency bands corresponding to a selected one of the third plurality of transmit power amplifiers, and generating signals providing a quantized indication of antenna impedance mismatch; and
   a control processing unit receiving and processing the quantized impedance mismatch indication signals and providing adjustment control signals to the variable transmit matching network to adjust the variable transmit matching network to achieve an impedance match of the antenna to the selected power amplifier.

28. The wireless communications device of claim 27, wherein the quantized impedance mismatch indication signals are generated by the impedance mismatch measuring and quantizing unit during a transmit slot of a Time Division Multiple Access period.

29. The wireless communications device of claim 27, wherein the control processing unit provides the adjustment control signals to the variable transmit matching network during a portion of a Time Division Multiple Access frame period not used by the wireless communications device for either transmission or reception.

30. The wireless communications device of claim 24, wherein the variable receive matching network includes either a set of fixed matching components for each of the second plurality of receive frequency bands, or step-switched reactances matching an impedance of the antenna to a selected receive bandpass filter in response to switch control signals from a control processing unit.

31. The wireless communications device of claim 24, wherein the variable transmit matching network includes either a set of fixed matching components for each of the first plurality of transmit frequency bands, or step-switched reactances matching an impedance of the antenna to a selected transmit power amplifier in response to switch control signals from a control processing unit.

32. The wireless communications device of claim 30, wherein the control processing unit stores predetermined values for the switch control signals for each of the second plurality of received frequency bands.

33. The wireless communications device of claim 27, wherein the control processing unit inhibits adjustment of the variable transmit matching network when the quantized impedance mismatch indication signals indicate an antenna impedance mismatch within a predetermined limit.

34. A wireless communication device for transmitting and receiving signals in multiple transmit and receive frequency bands using Time Division Multiple Access (TDMA) signal formats, the wireless communications device comprising:
an antenna for transmitting signals to and receiving signals from a wireless communications network;
a transmit/receive switch selectively coupling the antenna to a transmit signal path during a transmit time slot of a frame period of the TDMA signal format, and selectively coupling the antenna to a receive signal path during a receive time slot of the TDMA frame period;
a variable matching network connected in the transmit signal path between the antenna and a selected transmit power amplifier corresponding to a selected transmit frequency band;
an impedance mismatch measuring and quantizing unit connected in the transmit signal path between the selected transmit power amplifier and the variable matching network, the impedance mismatch measuring and quantizing unit measuring forward and reflected power of a signal transmitted on the selected transmit frequency band to determine a reflection coefficient, and generating quantized impedance mismatch indication signals indicative of the phase of the reflection coefficient, the impedance mismatch measuring and quantizing unit generating the mismatch indication signals during the transmit time slot of the TDMA frame period, the impedance mismatch indication signals including a first bit indicative of whether a reflection coefficient magnitude developed from the measured forward and reflected power is less than or greater than a predetermined value; and
a control processing unit receiving and processing the mismatch indication signals and providing adjustment control signals to the variable matching network during a portion of the TDMA frame period not utilized by the wireless communications device for transmission.

35. The wireless communications device of claim 34, wherein the adjustment control signals are provided by the control processing unit to the variable matching network during a portion of the TDMA frame period not used by the wireless communications device for reception.

36. The wireless communication device of claim 34, wherein if the first bit of the mismatch indication signals indicate a reflection coefficient less than the predetermined value, the control processing unit does not provide adjustment control signals to the variable matching network.

37. The wireless communication device of claim 34, wherein the mismatch indication signals include a 2-bit quadrant indication portion indicatiom in which quadrant of a complex plane the reflection coefficient lies.

38. The wireless communication device 37, wherein the 2-bit quadrant indication portion by the control processing unit to output the adjustment control signals from a precomputed look-up table.

39. A method of optimizing impedance between a transceiver and an antenna in a wireless communications device comprising:
measuring a signal to determine a complex reflection coefficient indicative of a quality of an impedance match between a transceiver and an antenna at a selected frequency band;
detecting an impedance mismatch between the transceiver and the antenna at the selected frequency band based on said complex reflection coefficient;
determining the phase of the complex reflection coefficient;
generating mismatch indication signals during a transmit time slot of a TDMA frame period based on the phase of the complex reflection coefficient, the mismatch indication signals including a first bit indicative of whether a reflection coefficient magnitude is less than or greater than a predetermined value; and
automatically adjusting a variable impedance matching network in the wireless communications device, during an idle period of communications, based on the mismatch indication signals to minimize the impedance mismatch at the selected frequency band.

40. The method of claim 39 wherein measuring a signal to determine a complex reflection coefficient comprises measuring an amplitude and phase of a reflected power of a transmitted signal during a TDMA transmit slot.

41. The method of claim 40 wherein measuring a signal to determine a complex reflection coefficient further comprises measuring a forward power of the transmitted signal during the TDMA transmit slot.

42. The method of claim 41 wherein detecting an impedance mismatch between the transceiver and the antenna at the selected frequency band comprises determining the magnitude of the forward power relative to the magnitude of the reflected power of the transmitted signal.

43. The method of claim 39 wherein detecting an impedance mismatch between the transceiver and the antenna at the selected frequency band comprises quantizing the complex reflection coefficient into one of a predetermined number of quality levels.

44. The method of claim 43 wherein detecting an impedance mismatch between the transceiver and the antenna at the selected frequency band is based on the quality levels.

45. The method of claim 44 wherein quantizing the complex reflection coefficient into one of a predetermined number of quality levels comprises quantizing the complex reflection coefficient into one of a plurality of amplitudes and one of a plurality of phases.

46. The method of claim 43 further comprising averaging a plurality of quantized complex reflection coefficients to determine an average complex reflection coefficient value.

47. The method of claim 46 further comprising inputting the averaged and complex reflection coefficient values into a controller.

48. The method of claim 39 wherein automatically adjusting a variable impedance matching network during an idle period of communications comprises increasing or decreasing capacitance in the variable impedance matching network.

49. The method of claim 39 wherein automatically adjusting a variable impedance matching network during an idle period of communications to minimize the impedance mismatch occurs during an idle slot of a TDMA frame.

50. A method of optimizing impedance between a transceiver and an antenna in a wireless communications device comprising:

measuring a forward power and a reflected power of a transmitted signal transmitted on a selected transmit frequency band to determine a reflection coefficient;

quantizing the forward power and the reflected power of the transmitted signal to determine a complex reflection coefficient;

generating a quantized impedance mismatch signal indicative of the phase of the complex reflection coefficient during the transmit time slot of the TDMA frame, the quantized impedance mismatch signal including a first bit indicative of whether a magnitude of the reflection coefficient is less than or greater than a predetermined value; and adjusting a variable impedance matching network responsive to the quantized impedance mismatch signal, during an idle period of communications in the TDMA frame, to minimize an impedance mismatch between the antenna and a transceiver at the selected frequency.

51. The method of claim 50 wherein adjusting a variable impedance matching network responsive to the impedance mismatch signal comprises generating an adjustment control signal to the variable matching network.

52. The method of claim 50 further comprising generating the adjustment control signal if the reflection coefficient is greater than the predetermined value.

53. The method of claim 50 wherein generating an impedance mismatch signal to a controller comprises generating a coarse indication of the phase of the complex reflection coefficient.

54. The method of claim 53 wherein generating an impedance mismatch signal to a controller comprises generating a 2-bit quadrant indication representative of a quadrant in a complex plane in which the complex reflection coefficient lies.

55. The method of claim 54 further comprising comparing the 2-bit quadrant indication with predetermined values in a lookup table.

56. The method of claim 55 further comprising generating the adjustment control signal based on the predetermined vales in the lookup table.

57. The method of claim 50 further comprising selectivity coupling an antenna to a receive signal path during a receive time slot of a TDMA frame, and a transmit signal path during a transmit time slot of a TDMA frame.

58. An impedance optimization circuit for a wireless communications device comprising:

a controller programmed to:

measure a forward power and a reverse power of a transmitted signal on a selected frequency band to determine a reflection coefficient indicative of an impedance match between a transceiver and an antenna at the selected frequency band;

detect an impedance mismatch between the transceiver and the antenna at the selected frequency band based on said reflection coefficient;

generate a quantized impedance mismatch signal indicative of the phase of the reflection coefficient, the quantized impedance mismatch signal including a bit indicative of whether a magnitude of the reflection coefficient is less than or greater than a predetermined value; and adjust an variable impedance matching network, during an idle period of communications, responsive to said quantized impedance mismatch signal to minimize the impedance mismatch between the transceiver and the antenna at the selected frequency band.

* * * * *